US011817809B2

(12) United States Patent
Liu et al.

(10) Patent No.: US 11,817,809 B2
(45) Date of Patent: Nov. 14, 2023

(54) MOTOR DRIVING SYSTEM CONVERTER FAULT DIAGNOSIS METHOD BASED ON ADAPTIVE SPARSE FILTERING

(71) Applicant: HUAZHONG UNIVERSITY OF SCIENCE AND TECHNOLOGY, Hubei (CN)

(72) Inventors: Zicheng Liu, Hubei (CN); Lanlan Fang, Hubei (CN); She Yan, Hubei (CN); Dong Jiang, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 0 days.

(21) Appl. No.: 17/992,946

(22) Filed: Nov. 23, 2022

(65) Prior Publication Data
US 2023/0163713 A1    May 25, 2023

(30) Foreign Application Priority Data
Nov. 25, 2021   (CN) .......................... 202111413481.5

(51) Int. Cl.
H02P 29/028    (2016.01)
G01R 31/34    (2020.01)
G05B 23/02    (2006.01)

(52) U.S. Cl.
CPC .......... *H02P 29/028* (2013.01); *G01R 31/343* (2013.01); *G05B 23/0229* (2013.01); *G05B 23/0254* (2013.01); *H02K 2213/03* (2013.01)

(58) Field of Classification Search
CPC . H02P 29/028; G01R 31/343; G05B 23/0229; G05B 23/0254; G05B 23/0281; G05B 23/024
See application file for complete search history.

(56) References Cited

U.S. PATENT DOCUMENTS 5,574,387 A * 11/1996 Petsche ............... G06F 18/2414
706/18
6,041,287 A *  3/2000 Dister ...................... G01R 1/04
702/182

OTHER PUBLICATIONS

Guowei Zhang "A Novel Deep Sparse Filtering Method for Intelligent Fault Diagnosis by Acoustic Signal Processing", 2020, Hindawi, 1-11 (Year: 2020).*

(Continued)

*Primary Examiner* — Bickey Dhakal
(74) *Attorney, Agent, or Firm* — JCIPRNET

(57) ABSTRACT

The disclosure discloses a motor driving system converter fault diagnosis method based on adaptive sparse filtering, and belongs to the field of driving system fault diagnosis. The disclosure applies an unsupervised learning algorithm to an application scene of converter fault diagnosis. Effective features are automatically extracted from original data, and the problem of manual feature design based on expert knowledge is solved. Meanwhile, in consideration of current fundamental period change caused by different rotation speed working conditions, rotation speed feedback is introduced, secondary sampling is carried out on current sampled at a constant frequency, it is ensured that the length of a signal input into the deep sparse filtering network is one fundamental wave period, redundant information is better removed from original data, the calculation burden is relieved, and the accuracy and rapidity of the diagnosis algorithm are improved to a certain extent.

8 Claims, 2 Drawing Sheets

(56) References Cited

OTHER PUBLICATIONS

Zongzhen Zhang, "Enhanced sparse filtering with strong noise adaptability and its application on rotating machinery fault diagnosis", 2020, Elseveir, 31-44 (Year: 2020).*

* cited by examiner

MOTOR DRIVING SYSTEM CONVERTER FAULT DIAGNOSIS METHOD BASED ON ADAPTIVE SPARSE FILTERING

CROSS-REFERENCE TO RELATED APPLICATION

This application claims the priority benefit of China application no. 202111413481.5, filed on Nov. 25, 2021. The entirety of the above-mentioned patent application is hereby incorporated by reference herein and made a part of this specification.

BACKGROUND

Technical Field

The disclosure belongs to the field of fault diagnosis of driving systems, and more particularly, relates to a motor driving system converter fault diagnosis method based on adaptive sparse filtering.

Description of Related Art

A motor driving system is a link to energy conversion and serves an important function in many fields such as aerospace, military, electric vehicles, and ship propulsion. In motor driving systems, a converter is most prone to failure due to its harsh working environment: high dv/dt, overvoltage, thermal stress, etc., among which short-circuit and open-circuit faults are the most common types of faults. Once a short-circuit fault occurs, it may cause abnormal overcurrent in a very short time, such as 10 μs, which may cause direct damage to the converter. Typically, there are hardware methods in commercial products to isolate short-circuit faults, such as fuses, circuit breakers, or di/dt feedback methods. However, rather than crashing the driving system immediately, open-circuit faults might degrade system performance, such as current distortion and electromagnetic torque ripple, which might not immediately cause the protection device to operate, but might cause a secondary failure or even cause the driving system to shut down. Therefore, research and studies have been widely carried out for open-circuit fault diagnosis of the switch tube of driving system converters.

These diagnostic methods may be divided into three categories: model-based methods, signal-based methods, and machine learning-based methods. The model-based method adopts a mathematical model to describe normal working conditions of the motor, and develop the diagnosis method based on the consistency between the measured output of an actual system and the predicted output of the mathematical model. This type of method requires accurate modeling of the system, whereas it is difficult to accurately model the actual system due to the influence of noise in the operating environment, and misdiagnosis is likely to occur. The signal-based method normally adopts time domain analysis, frequency domain analysis, or time-frequency domain analysis methods to process signals to obtain fault indicators. This type of methods does not require an explicit or complete system model, but might suffer performance degradation when working under unknown or unbalanced conditions. In contrast, the machine learning-based method achieves fault diagnosis by learning the mapping knowledge relationship between fault features and fault modes from historical data, and the learning is independent of the system model and not affected by system load changes.

At present, the most common method for fault diagnosis of converters based on machine learning is characterized by artificially designing fault features according to expert knowledge. Common technologies mainly include methods based on support vector machines (SVM), methods based on k-nearest neighbors (KNN), methods based on fuzzy logic, etc. The above-mentioned methods normally require the assistance of fast Fourier transform (FFT), wavelet changes and other data processing methods to design features, and still need to rely on expert knowledge. For these methods, the degree of intelligence needs to be improved, and the generalization ability is weak.

SUMMARY

In view of the above defects or requirements for improvement of the related art, the present disclosure provides a motor driving system converter fault diagnosis method based on adaptive sparse filtering (SF). The purpose of the disclosure is to simplify the fault diagnosis process of the switch tube of the converter, and improve the fault diagnosis accuracy simultaneously.

To achieve the above purpose, the present disclosure provides a motor driving system converter fault diagnosis method based on adaptive sparse filtering, including:

S1. Sampling current signals and rotation speed signals of a converter in different health states;

S2. Performing secondary sampling on the current signal according to an input dimension of an SF network and the rotation speed signal;

S3. Normalizing the current signal after the secondary sampling as a training data set;

S4. Adopting the training data set to train a fault diagnosis network; the fault diagnosis network includes a sparse filtering network and a Softmax classifier;

S5. Sampling the current signal and the rotation speed signal under the current operating state of the converter, using the process of steps S2 and S3 to process the sampled current signal, and inputting the processed signal into the above trained fault diagnosis network to realize feature extraction and automatic fault diagnosis.

Further, different health states include four states, namely, normal operating condition, upper-switch open-circuit fault, lower-switch open-circuit fault and single-phase open-circuit fault.

Further, the step S2 specifically includes:

a. Estimating a fundamental wave period of the current signal according to the sampled rotation speed signal, $$T = \frac{60}{np},$$

where n is a measured rotation speed, and p is the number of pole pairs of the motor;

b. Determining a sampling frequency f corresponding to the fundamental wave period according to the input dimension of the SF network, $$f = \frac{N_{in}}{T},$$

where $N_{in}$ is the input dimension of the DSF network, and T is the estimated fundamental wave period of the current signal;

c. Determining a secondary sampling interval of the current signal, $$N_{gap} = \frac{f_s}{f} - 1,$$

where $f_s$ is the constant sampling frequency of the current in the actual system, and $f$ is the sampling frequency corresponding to the input dimension of the SF network.

Further, specific implementation of step S3 is performing min-max normalization on the current signal after the secondary sampling:

$$\tilde{x} = \frac{x - x_{min}}{x_{max} - x_{min}}$$

In the formula, $x_{min}$ represents the minimum value of the data, and $x_{max}$ represents the maximum value of the data.

Further, the sparse filtering network specifically adopts a deep sparse filtering network.

Further, the deep sparse filtering network includes two layers of sparse filtering sub-networks; the first layer of sparse filtering sub-network maps input data from input space $R^{N_{in}}$ to feature space $R^{N_{mid}}$; the second layer of sparse filtering sub-network maps features from a space $R^{N_{mid}}$ to a feature space $R^{N_{out}}$ that is more abstract.

In general, compared with the related art, the above technical solutions conceived by the present disclosure is able to achieve the following advantageous effects.

(1) The disclosure applies an unsupervised learning algorithm to an application scene of converter fault diagnosis. Effective features are automatically extracted from original data, and the problem of manual feature design based on expert knowledge is solved. Meanwhile, considering that current fundamental period changes with the rotational speed of the motor in the real system, rotation speed feedback is introduced, secondary sampling is carried out on current sampled at a constant frequency, it is ensured that the length of a signal input into the deep sparse filtering network is a fundamental wave period, redundant information is better removed from original data, the calculation burden is relieved, and the accuracy and rapidity of the diagnosis algorithm are improved to a certain extent.

(2) Compared with other unsupervised learning algorithms, the deep sparse filtering network adopted has the advantages of adjusting fewer hyperparameters (only the output dimension of the model needs to be adjusted), having less difficulty in network debugging, and being able to automatically extract abstract features. Compared with the sparse filtering network, deep sparse filtering has further improved feature extraction ability and is able to better remove redundant information from the original data.

(3) The method of the present disclosure may be extended and applied to fault diagnosis of three-phase and multi-phase motor driving systems, and may also be extended to predict the health status of the system, which has more profound significance for the good operation of the system.

DESCRIPTION OF THE EMBODIMENTS

Figure 1:
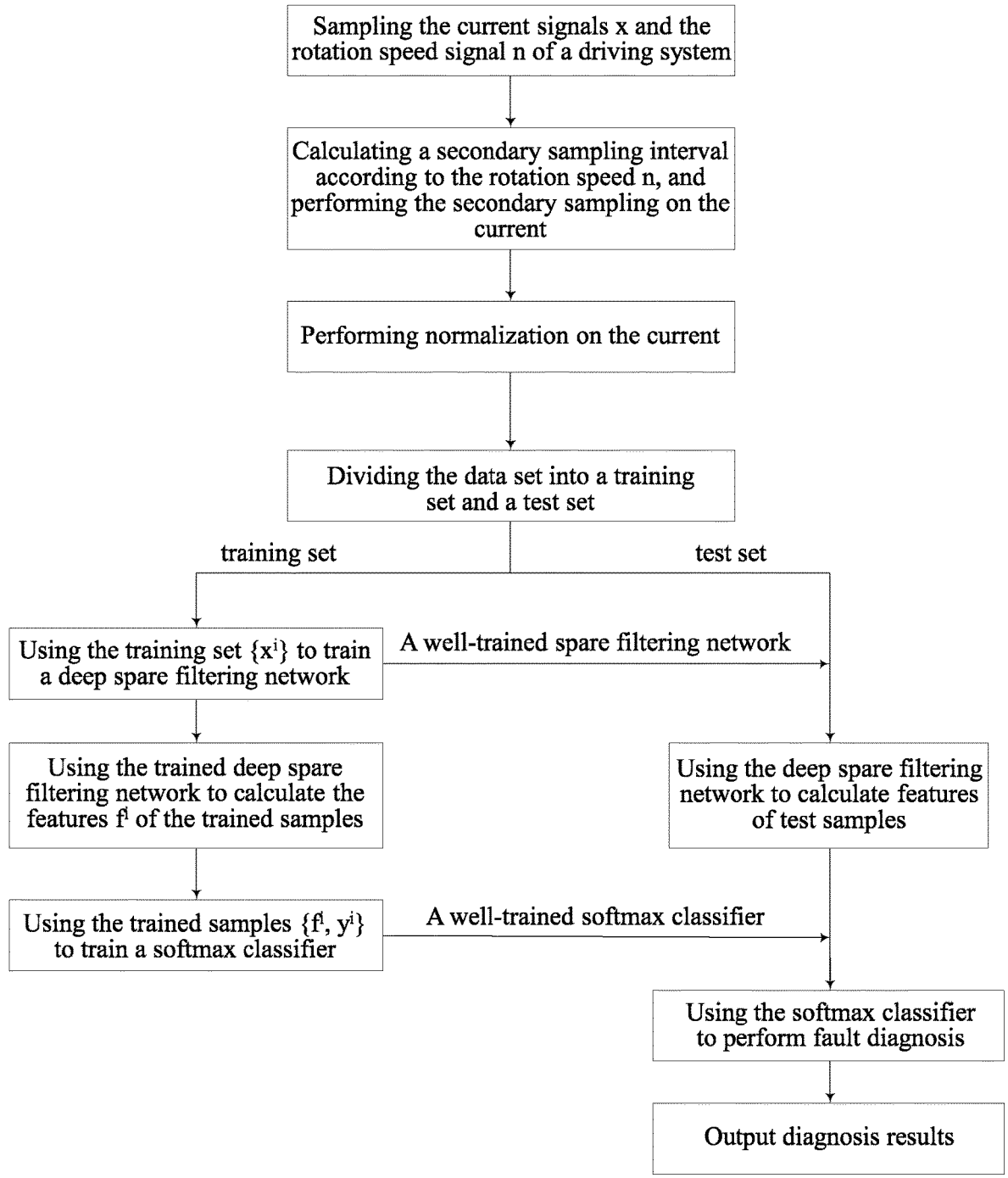
FIG. 1 is a method flow chart of the present disclosure.

In order to make the objectives, technical solutions and advantages of the present disclosure clearer, the present disclosure will be further described in detail below with reference to the accompanying drawings and embodiments. It should be understood that the specific embodiments described herein are only used to explain the present disclosure, but not to limit the present disclosure. In addition, the technical features involved in the various embodiments of the present disclosure described below can be combined with each other as long as they do not conflict with each other.

In machine learning methods, in the fault feature extraction stage, unsupervised learning has received increased attention in recent years. The method directly takes the original signal as input, and automatically extracts the features of the original signal through a series of linear or nonlinear transformations. Difficulties in manual design features relying on empirical knowledge are overcome. In the failure mode classification stage, the obtained features are directly sent to a trained classifier to achieve failure classification. The softmax classifier is a classic multi-classifier, which is commonly adopted due to its simple implementation and high classification accuracy. For fault feature extraction algorithms, SF is commonly adopted due to its small number of adjustable hyperparameters (only the output dimension of the model is adjustable) and the ability to automatically extract abstract features.

However, the original SF feature extraction ability is limited, and when the current signal is used as the SF input for fault diagnosis of a converter switch tube, compared with a vibration signal, a current signal is a low-frequency signal. Since the number of input points of the SF network is fixed, if the constant frequency sampling is still adopted for different rotation speed conditions, the signals input to the SF network will be fixed in the time span. However, because the rotation speeds are different, the fundamental wave period of the current signal will be quite different. Therefore, the input signal of the SF network accounts for different proportion of the fundamental wave period of the current, which will affect the accuracy and rapidity of fault diagnosis, which is quite different from the use of high-frequency vibration signals for fault diagnosis. Therefore, it is necessary to further study the fault diagnosis methods for switch tube of converter based on sparse filtering.

The present disclosure takes into account the variation of the current cycle caused by different rotation speed conditions, introduces rotation speed feedback, and performs secondary sampling on the current sampled at a constant frequency, so as to ensure that the length of the signal input to the deep sparse filtering network is a fundamental wave period, so that the redundant information is better removed from the original data, calculation burden is reduced, and the accuracy and rapidity of the diagnosis algorithm are improved to a certain extent.

As shown in FIG. 1, the motor driving system converter fault diagnosis method based on adaptive sparse filtering provided by the present disclosure includes the following contents.

(1) A time-domain phase current data and a rotation speed data of a driving system under different health states of the converter are sampled at a constant frequency $f_s$ to forma data set $\{x0^i, n^i, y^i\}_{i=1}^{M}$ containing M samples, where $x0^i$ represent a phase current data. Take the six-phase permanent magnet synchronous motor driving system as an example, $x0^i$ includes $\{x0_A{}^i, x0_B{}^i, x0_C{}^i, x0_U{}^i, x0_V{}^i, x0_W{}^i\}$, which are ABCUVW six-phase currents; n represents the rotation speed data; y represents a corresponding fault number, $y^i \in \{1, 2, \ldots, K\}$, where K is the number of fault types. In specific implementation, the sampling frequency is $f_s=10$ kHz, and for simplicity, A-phase fault is taken as an example in the condition of collecting data, and data in four kinds of fault conditions are collected: normal operating conditions, A-phase upper tube failure, A-phase lower tube failure, and A-phase open-phase failure. That is, set K=4, data at different torques and rotation speeds are collected, and each condition contains 250 samples, that is, M=1000, and each sample contains 10 k data points.

(2) Secondary sampling is performed on the current data $x0^i$ obtained by sampling at a constant frequency according to a rotation speed data $n^i$ obtained by sampling, and the selection of the secondary sampling interval is as follows:

a. Estimating a fundamental wave period of the current signal according to the sampled rotation speed signal, $$T = \frac{1}{f} = \frac{60}{np},$$

where n is a measured rotation speed, and p is the number of pole pairs of the motor. The number of pole pairs of the six-phase PMSM selected in the embodiment p=5, the fundamental wave period of the current signal of each sample is estimated according to the rotation speed signal obtained by sampling;

b. Determining a sampling frequency f corresponding to a fundamental wave period according to the input point of the SF network, $$f = \frac{N_{in}}{T},$$

where $N_{in}$ is the input dimension of the DSF network, and T is the estimated fundamental wave period of the current signal; the $N_{in}$ selected in the example is $N_{in}=200$;

c. Determining a secondary sampling interval $N_{gap}$ of the current signal, $$N_{gap} = \frac{f_s}{f} - 1,$$

where $f_s$ is the sampling frequency when the current signal is sampled at a constant frequency, and f is the sampling frequency corresponding to the input dimension of the SF network. Then after the secondary sampling, although the rotation speed variation causes the difference of the fundamental wave period of the current, the length of the $N_{in}$ current data input to the SF network is always kept as one fundamental wave period.

(3) The current data after the secondary sampling is normalized to construct a training data set $\{\tilde{x}, y\}$.

Considering that the current amplitude changes significantly with the motor operating conditions, and the direct input to the network will have a negative impact on the convergence speed and accuracy of the network, the embodiment of the present disclosure adopts a min-max linear normalization method:

$$\tilde{x} = \frac{x - x_{min}}{x_{max} - x_{min}}$$

(4) The normalized phase current data $\{\tilde{x}^i_{ph}\}$, ph= A, B, C, . . . is adopted to train the fault diagnosis network; the fault diagnosis network includes a sparse filtering network and a Softmax classifier.

Figure 3:
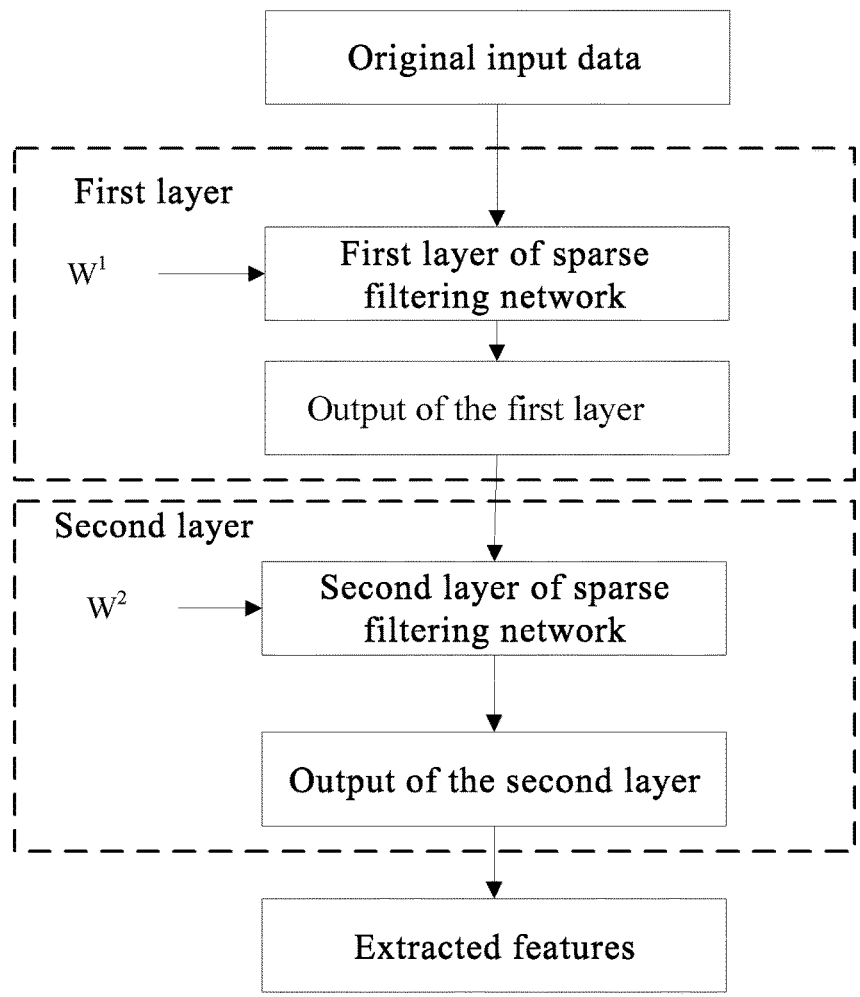
FIG. 3 is a structural diagram of an algorithm of deep sparse filtering in the present disclosure.

In order to better remove the redundant information from the original data and more effectively extract the fault features from the original data, the embodiment of the present disclosure adopts a deep sparse filtering (DSF) network as shown in FIG. 3, and the specific training process is as follows.

Figure 2:
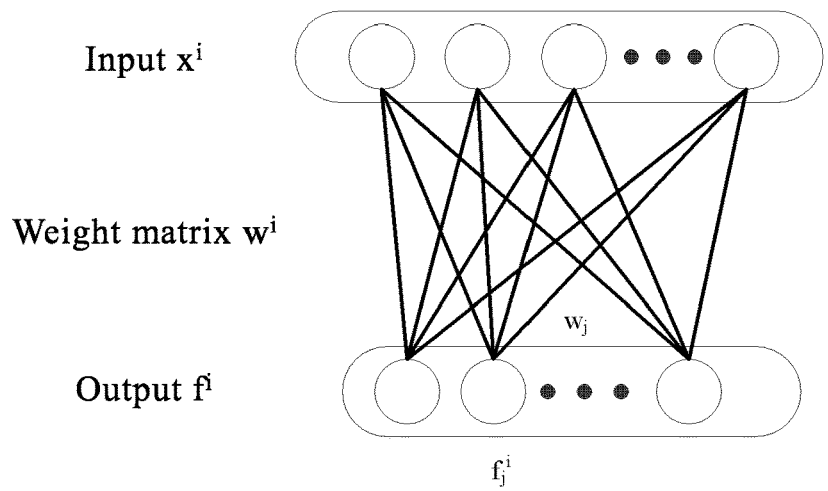
FIG. 2 is a schematic diagram of a sparse filtering structure.

The DSF network includes two layers of sparse filtering. The input data is a phase current sample $\tilde{x}^i$ after secondary sampling and normalization, and the output is a feature matrix $\hat{f}^i$. The calculation process for the two layers of network is the same, so one layer of sparse filtering network is used as an example for description, as shown in FIG. 2: The network adopts a weight matrix w to map the input data, and adopts a soft threshold function as an activation function of the network to extract the features of the sample, namely:

$$f_j^i = \sqrt{\varepsilon + (W_j^T x^i)^2}$$

In the formula, $f_j^i$ represents the value at the position of column i in row j of the feature matrix f, each row of the feature matrix f is a feature and each column is a sample. $\varepsilon = 1 \times 10^{-8}$, and each iterative process of sparse filtering mainly includes the following steps.

a. Row normalization: The L2 norm is adopted to normalize each row of the feature matrix, as shown in the following formula:

$$\tilde{f}_j = \frac{f_j}{\|f_j\|_2}$$

In the formula, $f_j$ represents the j-th row of the feature matrix f before row normalization, $\tilde{f}_j$ is the j-th row of the feature matrix after normalization;

b. Column normalization: Then L2 norm normalization is performed on each column of the feature matrix, so that the features fall on the unit sphere of L2 norm, as shown in the following formula:

$$\hat{f}^i = \frac{\tilde{f}^i}{\|\tilde{f}^i\|_2}$$

In the formula, $\tilde{f}^i$ is the i-th column of the feature matrix f before column normalization, $\hat{f}^i$ is the i-th column of the feature matrix after column normalization; and finally the feature matrix $\hat{f}$ is obtained;

c. The L1 norm is adopted to optimize the sparsity of the normalized features, as follows:

$$\sum_{i=1}^{M} \|\hat{f}^i\|_1 = \sum_{i=1}^{M} \left\| \frac{\tilde{f}^i}{\|\tilde{f}^i\|_2} \right\|_1$$

In the formula, M represents the number of samples.

d. An objective function is constructed, and a weight matrix w is trained by minimizing the objective function, as shown in the following formula, $$\min \sum_{i=1}^{M} \|\tilde{f}^i\|_1 = \min \sum_{i=1}^{M} \left\| \frac{\tilde{f}^i}{\|\tilde{f}^i\|_2} \right\|_1$$

The trained DSF network is adopted to calculate the feature $f_{ph}^i$ of the training samples according to a forward propagation process.

After obtaining the features $\{f_{ph}^i\}$, ph=A, B, C, ... of each phase current, these features are spliced into a column vector $f_{fin}^i = [\{f_A^i\}; \{f_B^i\}; \{f_C^i\}; \ldots]$ in the order of phases, and combined with corresponding fault type labels $y^i$, the softmax classification network is trained. The specific process is as follows:

a. For the data set $\{f_{fin}^i, y^i\}_{i=1}^M$, forward propagation is performed first, that is, the input features are adopted to calculate the likelihood of each category, as shown in the following formula:

$$h_\theta(f_{fin}^i) = \begin{bmatrix} p(y^i = 1|f_{fin}^i; \theta) \\ p(y^i = 2|f_{fin}^i; \theta) \\ \vdots \\ p(y^i = K|f_{fin}^i; \theta) \end{bmatrix} = \frac{1}{\sum_{j=1}^{K} e^{\theta_j^T f_{fin}^i}} \begin{bmatrix} e^{\theta_1^T f_{fin}^i} \\ e^{\theta_2^T f_{fin}^i} \\ \vdots \\ e^{\theta_K^T f_{fin}^i} \end{bmatrix}$$

In the formula, $\theta$ is a parameter in the softmax classifier, $\theta = [\theta_1, \theta_2, \ldots, \theta_K]^T$, $p(y^i = k | f_{fin}^i)$, $k=1, \ldots, K$ are the likelihood of each category $y^i$ under the input $f_{fin}^i$.

b. The value of a cost function is calculated, and the cost function is as follows:

$$J(\theta) = -\frac{1}{M} \left[ \sum_{i=1}^{M} \sum_{j=1}^{K} I\{y^i = j\} \log \frac{e^{\theta_j^T f_{fin}^i}}{\sum_{l=1}^{K} e^{\theta_l^T f_{fin}^i}} \right] + \frac{\lambda}{2} \sum_{k=1}^{K} \sum_{l=1}^{N} \theta_{kl}^2$$

In the formula, M is the number of samples in the training set; I is an indicative function, that is, if the condition is true, the function value is 1, otherwise it is 0; the second term is a weight decay parameter, which is to prevent the network from overfitting and causing reduction in generalization transformation ability.

c. Backpropagation: A gradient descent algorithm is adopted to optimize the weight parameters in the network according to the cost function.

(5) The current signal and rotation speed signal of the converter in the current operating state are sampled. A secondary sampling is performed on the current data through the rotation speed, and then the normalization is performed on the data. The processed signal is input into the trained network. In this manner, feature extraction and automatic diagnosis of fault signals may be realized.

By using the method of the present disclosure, 100% accuracy on training and 99.825% accuracy on test may be achieved. To further verify the effectiveness of this method, this method is compared with Support Vector Machine (SVM) and Convolutional Neural Network (CNN) in terms of diagnostic accuracy and complexity of network structure.

The same current data set is applied to CNN and SVM network respectively, the accuracy of this data set on CNN and SVM can be obtained. In terms of the complexity of the network structure, the comparison is made mainly between the hyperparameters. Because the hyperparameters need to be set manually. The larger the number of hyperparameters, the more difficult and time-consuming the debugging will be. In terms of sparse filtering: there is only one hyperparameter (the number of features), in terms of the deep sparse filtering network adopted in the present disclosure, the number of hyperparameters to be adjusted is 2 ($N_{mid}$, $N_{out}$); CNN: the number of hyperparameters is large, and these hyperparameters include: kernel size, number of neural network layers, activation function, loss function, optimizer adopted (gradient descent RMSprop), batch size, number of epochs for training, etc.; SVM: there are mainly two hyperparameters, namely Penalty coefficient C and coefficient γ of the RBF kernel function. The final comparison results are shown in Table 1. It can be seen that the accuracy of CNN and sparse filtering is high, but CNN needs to debug the most hyperparameters, and the accuracy of SVM is relatively low. To sum up, the sparse filtering method provided in the disclosure is optimal.

TABLE 1

Comparison results of sparse filtering and other methods

|  | Deep sparse filtering (with secondary sampling) | Deep sparse filtering (without secondary sampling) | CNN | SVM |
| --- | --- | --- | --- | --- |
| Accuracy | 99.83% | 96.00% | 99.25% | 92.59% |
| Hyperparameters | Less | Less | More | Less |

A motor driving system fault diagnosis method based on adaptive sparse filtering provided by the present disclosure firstly samples the current signal and the rotation speed signal of the driving system at a constant frequency. Secondly, the interval of the secondary sampling of the current signal is calculated according to the rotation speed obtained by sampling, and the secondary sampling is performed on the current signal according to the calculation result. Then, min-max normalization is performed on the current subjected to secondary sampling, and then the normalized current is sent to a deep sparse filtering network to extract fault features. Finally, the extracted features are sent to the softmax classifier for fault classification. The present disclosure conducts secondary sampling on the current by introducing rotation speed feedback, which ensures that the length of the data input to the DSF network is kept as a fundamental wave period, so that redundant information is better removed from original data, and the calculation burden is relieved. Besides, a deep sparse filtering network is adopted, which is able to better extract the high-dimensional features of the fault signal.

Those skilled in the art can easily understand that the above are only preferred embodiments of the present disclosure, and are not intended to limit the present disclosure. Any modifications, equivalent replacements and improvements made within the spirit and principles of the present disclosure, etc., should be included within the protection scope of the present disclosure.

What is claimed is:

1. A motor driving system converter fault diagnosis method based on adaptive sparse filtering, comprising:
S1. sampling current signals and rotation speed signals of a motor driving system when a converter in the motor driving system is in different health states;
S2. performing a secondary sampling on the current signals according to an input dimension of an sparse filtering (SF) network and the rotation speed signals, wherein the step S2 comprises:
a. estimating a fundamental wave period of the current signals according to the sampled rotation speed signals, $$T = \frac{60}{np},$$

where n is a measured rotation speed, and p is a number of pole pairs of a motor;
b. determining a sampling frequency f corresponding to the one fundamental wave period according to an input dimension of a deep sparse filtering network (DSF), $$f = \frac{N_{in}}{T},$$

wherein $N_{in}$ is the input dimension of the DSF network, and T is an estimated fundamental wave period of the current signals; and
c. determining a secondary sampling interval of the current signals, $$N_{gap} = \frac{f_s}{f} - 1,$$

wherein $f_s$ is a constant sampling frequency of the current signals, and f is a sampling frequency corresponding to the input dimension of the sparse filtering network;
S3. normalizing the current signals after the secondary sampling as a training data set;
S4. adopting the training data set to train a fault diagnosis network; wherein the fault diagnosis network comprises the sparse filtering network and a Softmax classifier; and
S5. sampling the current signals and the rotation speed signals under a current operating state of the converter, using the process of steps S2 and S3 to process the sampled current signals, and inputting the processed signal into the trained fault diagnosis network to realize feature extraction and automatic fault diagnosis.

2. The motor driving system converter fault diagnosis method based on adaptive sparse filtering according to claim 1, wherein the different health states comprise four states, namely, a normal operating condition, upper-switch open-circuit fault, lower-switch open-circuit fault and single-phase open-circuit fault.

3. The motor driving system converter fault diagnosis method based on adaptive sparse filtering according to claim 2, wherein the sparse filtering network adopts the deep sparse filtering network.

4. The motor driving system converter fault diagnosis method based on adaptive sparse filtering according to claim 1, wherein the sparse filtering network adopts the deep sparse filtering network.

5. The motor driving system converter fault diagnosis method based on adaptive sparse filtering according to claim 1, wherein the step S3 is performing min-max normalization on the current signals after the secondary sampling:

$$\tilde{x} = \frac{x - x_{min}}{x_{max} - x_{min}}$$

wherein x represents current data after the secondary sampling, $x_{min}$ represents a minimum value of the data, and $x_{max}$ represents a maximum value of the data.

6. The motor driving system converter fault diagnosis method based on adaptive sparse filtering according to claim 5, wherein the sparse filtering network adopts the deep sparse filtering network.

7. The motor driving system converter fault diagnosis method based on adaptive sparse filtering according to claim 6, wherein the deep sparse filtering network comprises two layers of sparse filtering sub-networks; the first layer of sparse filtering sub-network maps input data from an input space $R^{N_{in}}$ to a feature space $R^{N_{mid}}$; the second layer of sparse filtering sub-network maps features from a space $R^{N_{mid}}$ to a feature space $R^{N_{out}}$ that is more abstract.

8. A motor driving system converter fault diagnosis system based on adaptive sparse filtering, comprising: a computer-readable storage medium and a processor;
wherein the computer-readable storage medium is configured to store executable instructions;
the processor is configured to read the executable instructions stored in the computer-readable storage medium, and execute the motor driving system converter fault diagnosis method based on adaptive sparse filtering according to claim 1.

* * * * *